United States Patent
Chang et al.

(10) Patent No.: US 9,496,493 B2
(45) Date of Patent: Nov. 15, 2016

(54) RESISTIVE RANDOM ACCESS MEMORY AND METHOD FOR PRODUCING SAME

(71) Applicant: NATIONAL SUN YAT-SEN UNIVERSITY, Kaohsiung (TW)

(72) Inventors: Ting-Chang Chang, Kaohsiung (TW); Kuan-Chang Chang, Kaohsiung (TW); Tsung-Ming Tsai, Kaohsiung (TW); Tian-Jian Chu, Kaohsiung (TW); Chih-Hung Pan, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days.

(21) Appl. No.: 14/563,708

(22) Filed: Dec. 8, 2014

(65) Prior Publication Data
US 2016/0118579 A1    Apr. 28, 2016

(30) Foreign Application Priority Data

Oct. 27, 2014 (TW) .............................. 103137061 A

(51) Int. Cl.
H01L 47/00 (2006.01)
H01L 45/00 (2006.01)

(52) U.S. Cl.
CPC ....... H01L 45/1253 (2013.01); H01L 45/1233 (2013.01); H01L 45/147 (2013.01); H01L 45/1625 (2013.01)

(58) Field of Classification Search
CPC ........... H01L 21/1253; H01L 45/1253; H01L 45/1233; H01L 45/147
USPC .......................................... 257/2, 4
See application file for complete search history.

(56) References Cited

U.S. PATENT DOCUMENTS

| 8,009,454 B2 | 8/2011 | Lee et al. | |
| 8,686,389 B1* | 4/2014 | Wang | H01L 45/145 257/2 |
| 8,791,444 B2 | 7/2014 | Chin et al. | |
| 2007/0215977 A1 | 9/2007 | Lee et al. | |
| 2012/0086104 A1* | 4/2012 | Marsh | C23C 16/409 257/532 |
| 2014/0175356 A1 | 6/2014 | Wang et al. | |
| 2014/0322862 A1* | 10/2014 | Xie | H01L 27/2481 438/104 |
| 2015/0093876 A1* | 4/2015 | Butcher | H01L 45/08 438/382 |
| 2015/0249211 A1* | 9/2015 | Knobloch | H01L 27/2463 257/5 |

FOREIGN PATENT DOCUMENTS

TW    201143080 A1    12/2011

OTHER PUBLICATIONS

Wouters et al, "Analysis of Complementary RRAM Switching," IEEE Electron Device Letters, 2012, pp. 1186-1188, vol. 33, No. 8.

* cited by examiner

*Primary Examiner* — David S Blum
(74) *Attorney, Agent, or Firm* — Muncy, Geissler, Olds & Lowe, P.C.

(57) ABSTRACT le;.5qA resistive random access memory includes two electrode layers and a resistive switching layer mounted between the two electrode layers. The resistive switching layer consists essentially of insulating material with oxygen, metal material, and mobile ions. The polarity of the mobile ions is opposite to the polarity of oxygen ions. A method for producing a resistive random access memory includes preparing a first metal layer and sputtering a resistive switching layer on the first metal layer. Surface treatment is conducted on the resistive switching layer by using a plasma containing mobile ions to dope the mobile ions into the resistive switching layer. The polarity of the mobile ions is opposite to the polarity of oxygen ions. Then, a second metal layer is sputtered on the resistive switching layer.

7 Claims, 5 Drawing Sheets

RESISTIVE RANDOM ACCESS MEMORY AND METHOD FOR PRODUCING SAME

BACKGROUND OF THE INVENTION

1. Field of the Invention

The present invention relates to a resistive random access memory and a method for producing the resistive random access memory and, more particularly, to a resistive random access memory providing dual ion effects and a method for producing the resistive random access memory.

2. Description of the Related Art

Memories have been widely used in various electronic products. Due to the increasing need of data storage, the demands of the capacities and performances of the memories become higher and higher. Among various memory elements, resistive random access memories (RRAMs) have an extremely low operating voltage, an extremely high read/write speed, and highly miniaturization of the element size and, thus, may replace the conventional flash memories and dynamic random access memories (DRAMs) as the main stream of memory elements of the next generation.

FIG. 1 is a perspective view of a conventional resistive random access memory 9 for complementary resistive switches (CRS). The conventional resistive random access memory 9 includes a first metal layer 91, a first resistive switching layer 92, a second metal layer 93, a second resistive switching layer 94, and a third metal layer 95. The first resistive switching layer 92 is formed by silicon oxide and is located between the first metal layer 91 and the second metal layer 93. The second resistive switching layer 94 is formed by silicon oxide and is located between the second metal layer 93 and the third metal layer 95. A metal/insulator/metal/insulator/metal (MIMIM) structure is, thus, formed. Such a structure is obtained by reverse docking of two resistive random access memory elements of a metal/insulator/metal (MIM) structure. An electric field can be created to drive oxygen ions in the first and second resistive switching layers 92 and 94 to react with metal filaments to thereby undergo an oxidation/reduction reaction, forming a low resistance state (LRS) or a high resistance state (HRS) for storing data.

When a positive bias or a negative bias is applied to the conventional resistive random access memory 9 for complementary resistive switches, one of the two resistive random access memory elements undergoes a setting procedure, and the other undergoes a resetting procedure. By the asymmetry of the setting voltage and the resetting voltage respectively of the two resistive random access memory elements, a memory identification window W (FIG. 2) can be generated in the current-voltage curve to fix the sneak current of an integrated circuit of the resistive random access memory, an example of which is shown by Dirk J. Wouters, Leqi Zhang, Andrea Fantini, Robin Degraeve, Ludovic Goux, Yang Y. Chen, Bogdan Govoreanu, Gouri S. Kar, Guido V. Groeseneken, and Malgorzata Jurczak ("Analysis of Complementary RRAM Switching", IEEE ELECTRON DEVICE LETTERS, VOL. 33, NO. 8, AUGUST 2012). However, the resistive random access memory 9 for complementary resistive switches requires formation of a five-layer (MIMIM) structure, which involves complicated production process and which is difficult to reduce the production costs.

Thus, improvement to the conventional techniques is required for enhancing the utility.

SUMMARY OF THE INVENTION

An objective of the present invention is to provide a resistive random access memory using a metal/insulator/metal (three-layer) structure to fix the sneak current of an integrated circuit of the conventional resistive random access memory while reducing the production costs.

Another objective of the present invention is to provide a method for producing a resistive random access memory using a metal/insulator/metal (three-layer) structure to fix the sneak current of an integrated circuit of the conventional resistive random access memory while reducing the production costs.

The present invention fulfills the above objectives by providing a resistive random access memory including two electrode layers and a resistive switching layer mounted between the two electrode layers. The resistive switching layer consists essentially of insulating material with oxygen, metal material, and mobile ions. The polarity of the mobile ions is opposite to the polarity of oxygen ions.

The thickness of the resistive switching layer can be 2-20 nm.

The two electrode layers can be made of platinum or titanium nitride.

The mobile ions can include hydrogen ions, lithium ions, sodium ions, magnesium ions, potassium ions, or calcium ions.

The mole percent of the mobile ions can be 0.01-10%.

The insulating material with oxygen can include silicon oxide or hafnium oxide.

The metal material can be selected from the group consisting of titanium, zirconium, hafnium, zinc, tin, nickel, aluminum, gallium, indium, or alloys thereof.

In another aspect, the present invention provides a method for producing a resistive random access memory. The method includes preparing a first metal layer; sputtering a resistive switching layer on the first metal layer; conducting surface treatment on the resistive switching layer by using a plasma containing mobile ions to dope the mobile ions into the resistive switching layer, with a polarity of the mobile ions being opposite to a polarity of oxygen ions; and sputtering a second metal layer on the resistive switching layer.

The mobile ions can include lithium ions, sodium ions, magnesium ions, potassium ions, or calcium ions.

The mole percent of the mobile ions can be 0.01-10%.

The insulating material with oxygen can include silicon oxide or hafnium oxide.

The metal material can be selected from the group consisting of titanium, zirconium, hafnium, zinc, tin, nickel, aluminum, gallium, indium, or alloys thereof.

The first and second metal layers can be made of platinum or titanium nitride.

In the resistive random access memory and its producing method, the resistive switching layer includes ions with opposite polarities such that cations and anions participate in the resistance switching reaction when the resistive random access memory operates, simultaneously providing a setting effect and a resetting effect. Thus, the current-voltage curve of the resistive random access memory according to the present invention can be switched between a high resistance state and a low resistance state, presenting bipolar switching characteristics while including a memory identification window to fix the sneak current in the integrated circuit of the conventional resistive random access memory.

Furthermore, the resistive random access memory according to the present invention possesses the characteristics of the metal/insulator/metal/insulator/metal (five-layer) structure of the conventional resistive random access memory but only requires a metal/insulator/metal (three-layer) structure, which achieves the effect of reducing the production costs and mitigates the disadvantages of difficulties in reducing the production costs of the conventional resistive random access memory.

The present invention will become clearer in light of the following detailed description of illustrative embodiments of this invention described in connection with the drawings.

BRIEF DESCRIPTION OF THE DRAWINGS

The illustrative embodiments may best be described by reference to the accompanying drawings where.

DETAILED DESCRIPTION OF THE INVENTION

Figure 1:
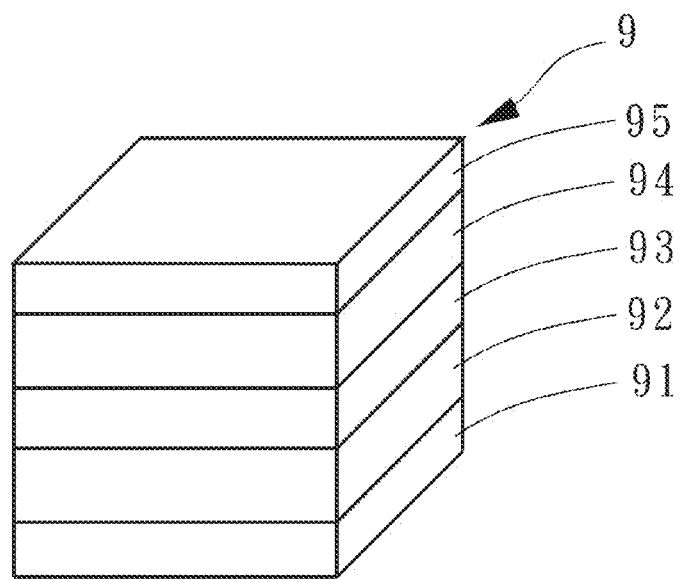
FIG. 1 is a perspective view of a conventional resistive random access memory for complementary resistive switches.
Figure 2:
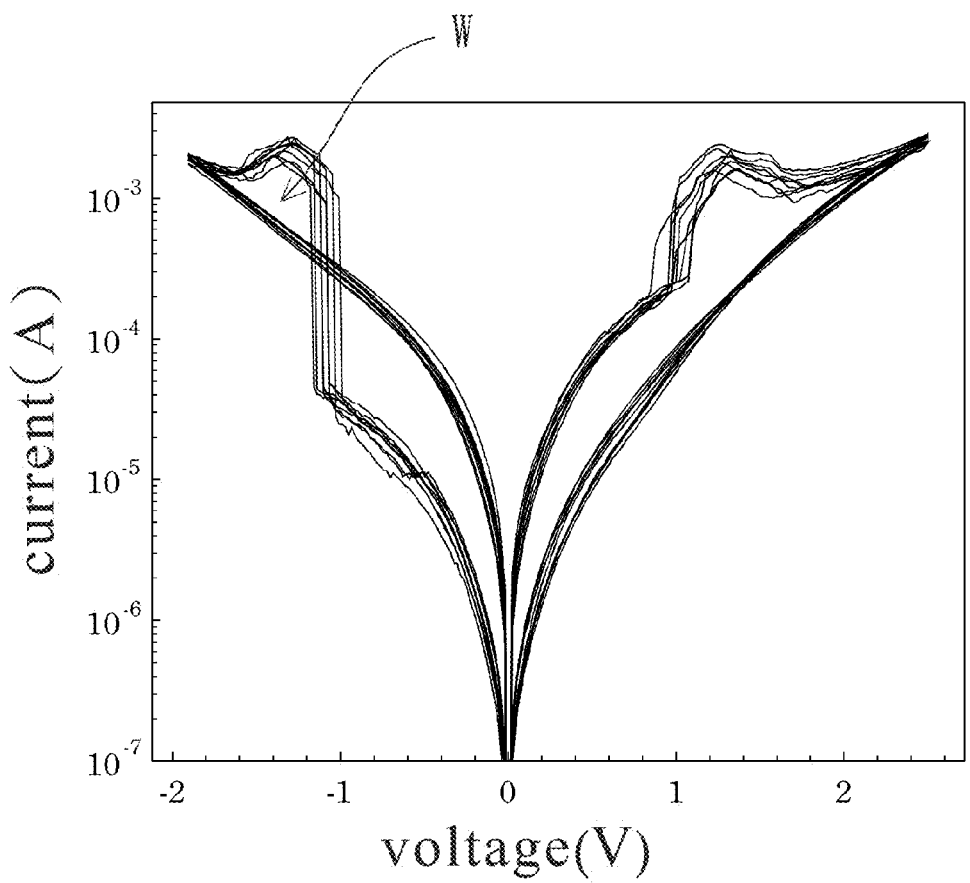
FIG. 2 is a diagram of a current-voltage curve of the conventional resistive random access memory of FIG. 1.
Figure 3:
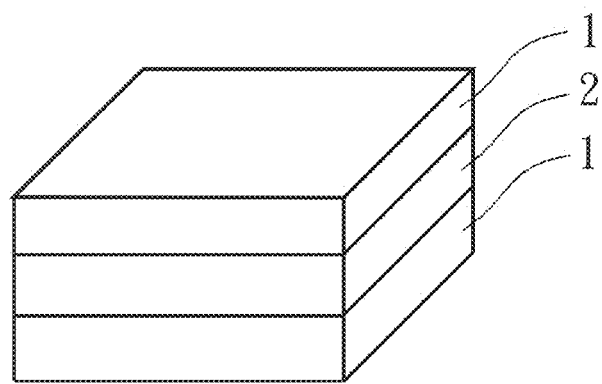
FIG. 3 is a perspective view of a resistive random access memory of an embodiment according to the present invention.

FIG. 3 is a perspective view of a resistive random access memory of an embodiment according to the present invention. The resistive random access memory includes two electrode layers 1 and a resistive switching layer 2. The two electrode layers 1 are made of conductive material and can be used to apply a bias signal to the resistive random access memory. The resistive switching layer 2 is mounted between the two electrode layers 1. The resistive switching layer 2 consists essentially of insulating material with oxygen, metal material, and mobile ions. The polarity of the mobile ions is opposite to the polarity of oxygen ions ($O^{2-}$). By using the opposite polarities of ions, cations and anions both participate in the resistance switching reaction when the resistive random access memory operates, simultaneously providing a setting effect and a resetting effect to possess the characteristics of an MIMIM structure of the conventional resistive random access memory for complementary resistive switches.

In this embodiment, the two electrode layers 1 can be made of conductive material, such as platinum (Pt) or titanium nitride (TiN), to increase the conduction effect. The thickness of the resistive switching layer 2 can be 2-20 nm to provide an appropriate resistance switching effect. The insulating material with oxygen can include silicon oxide ($S_iO_x$, x=1 or 2) or hafnium oxide ($H_fO_x$, x=1 or 2) to change the resistance state of the resistive switching layer 2 by an oxidation/reduction action, which can be appreciated by one having ordinary skill in the art. The metal material can be selected from the group consisting of titanium (Ti), zirconium (Zr), hafnium (Hf), zinc (Zn), tin (Sn), nickel (Ni), aluminum (Al), gallium (Ga), indium (In), or alloys thereof. The mobile ions can include hydrogen ions ($H^+$), lithium ions ($Li^+$), sodium ions ($Na^+$), magnesium ions ($Mg^+$), potassium ions ($K^+$), or calcium ions ($Ca^{2+}$). A mole percent of the mobile ions can be 0.01-10%. As an example, the mole percent of the mobile ions in the resistive switching layer 2 is 1%, with the remainder being the insulating material with oxygen and the metal material, possessing appropriate effects of setting and resetting. Although an embodiment of using hydrogen ions as the mobile ions will be set forth hereinafter, the present invention is not limited to this example.

With reference to FIG. 3, in use of the resistive random access memory of the embodiment according to the present invention, a bias signal is applied between the two electrode layers 1. The working signal can be a pulse width modulation (PWM) signal. The polarity (positive or negative), amplitude, working period, and frequency (the number of pluses per unit of time) of the pulse width modulation signal can be adjusted. After an initial forming process, an electric field can be used to drive the oxygen ions and the hydrogen ions to react with the metal filaments of the resistive switching layer 2 to undergo an oxidation/reduction reaction. The oxygen ions can generate a current-voltage curve of high and low resistance states of bipolar switching (see FIG. 4a). The hydrogen ions can also generate a current-voltage curve of high and low resistance states of bipolar switching (see FIG. 4b).

Figure 4A:
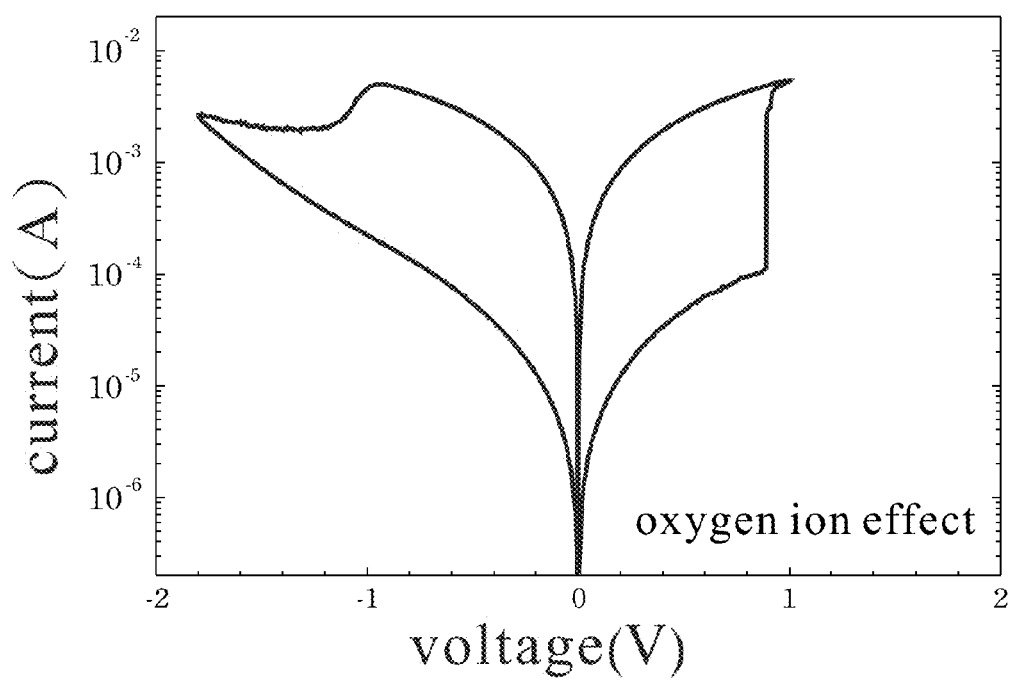
FIG. 4a is a diagram of a current-voltage curve of the resistive random access memory of the embodiment according to the present invention resulting from the effect of oxygen ions.
Figure 4B:
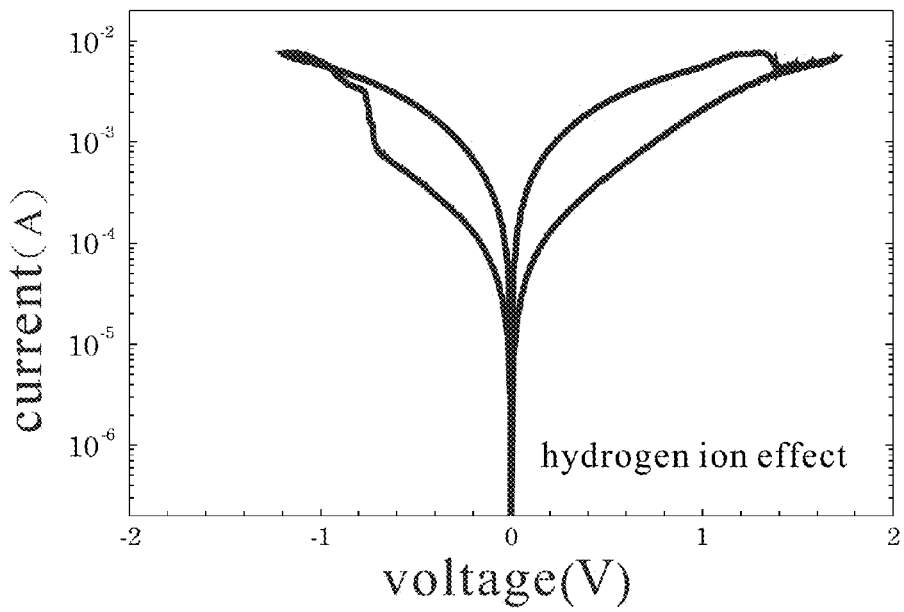
FIG. 4b is a diagram of a current-voltage curve of the resistive random access memory of the embodiment according to the present invention resulting from the effect of hydrogen ions.
Figure 4C:
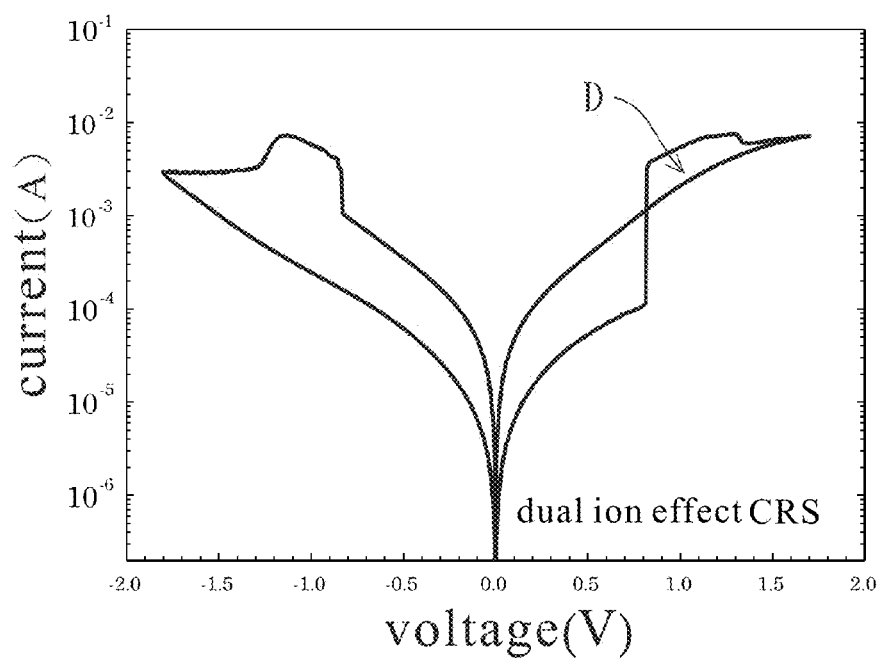
FIG. 4c is a diagram of a current-voltage curve of the resistive random access memory of the embodiment according to the present invention resulting from the effects of both of oxygen ions and hydrogen ions.

As can be seen from FIGS. 4a and 4b illustrating the current-voltage curves generated by the oxygen ions and the hydrogen ions according to the present invention, when the bias signal is a positive voltage, the oxygen ions and hydrogen ions respectively form a setting effect and a resetting effect. On the other hand, when the bias signal is a negative voltage, the oxygen ions and the hydrogen ions respectively form a resetting effect and a setting effect. Since both of the oxygen ions and the hydrogen ions participate in the resistance switching reaction, other mobile cations can provide substantially the same effect. Redundant description is not required. Thus, as can be seen from FIG. 4c, the current-voltage curve of the resistive random access memory of the embodiment according to the present invention possesses both of the effects of the current-voltage curves of the oxygen ions and the hydrogen ions. The current-voltage curve of the resistive random access memory of the embodiment can be switched into a high resistance state and a low resistance state while presenting bipolar switching characteristics and including a memory identification window D, possessing the characteristics of the metal/insulator/metal/insulator/metal (MIMIM) structure of the conventional resistive random access memory to fix the sneak current in the integrated circuit of the conventional resistive random access memory.

Figure 5:
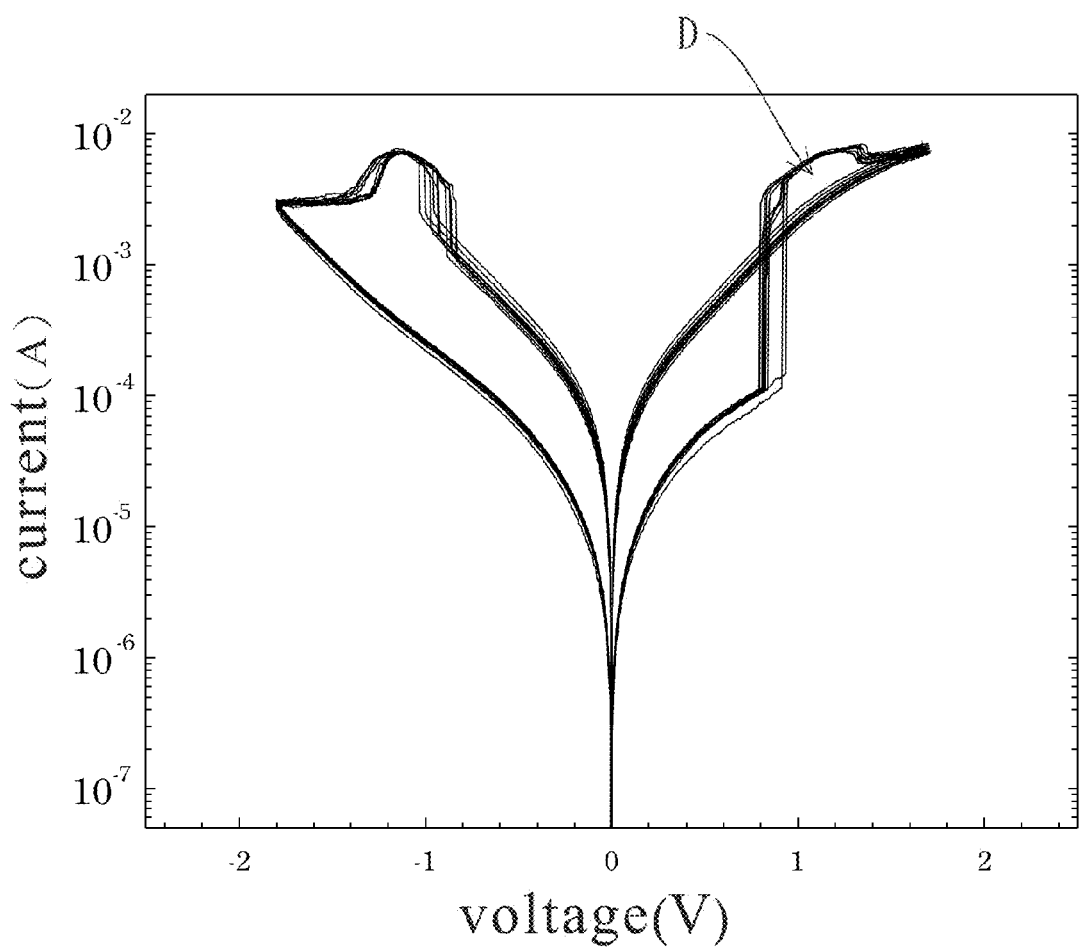
FIG. 5 is a diagram illustrating resistance switching of the current-voltage curve of the resistive random access memory of the embodiment according to the present invention.

FIG. 5 is a diagram illustrating resistance switching of the current-voltage curve of the resistive random access memory of the embodiment according to the present invention. When the frequency of the pulse width modulation signal changes, a different number of pulses can be generated in the resistive switching layer 2. As can be seen from FIG. 5, the current-voltage curve of the resistive random access memory of the embodiment can be switched into a high resistance state and a low resistance state while presenting bipolar switching characteristics and including a memory identification window D, possessing the characteristics of the metal/insulator/metal/insulator/metal (MIMIM) structure of the conventional resistive random access memory to fix the sneak current in the integrated circuit of the conventional resistive random access memory. Thus, the resistive random access memory of the embodiment according to the present invention only requires a metal/insulator/metal (three-layer) structure to include the characteristics of the metal/insulator/metal/insulator/metal (five-layer) structure of the conventional resistive random access memory, achieving the effect of reducing the production costs.

Figure 6:
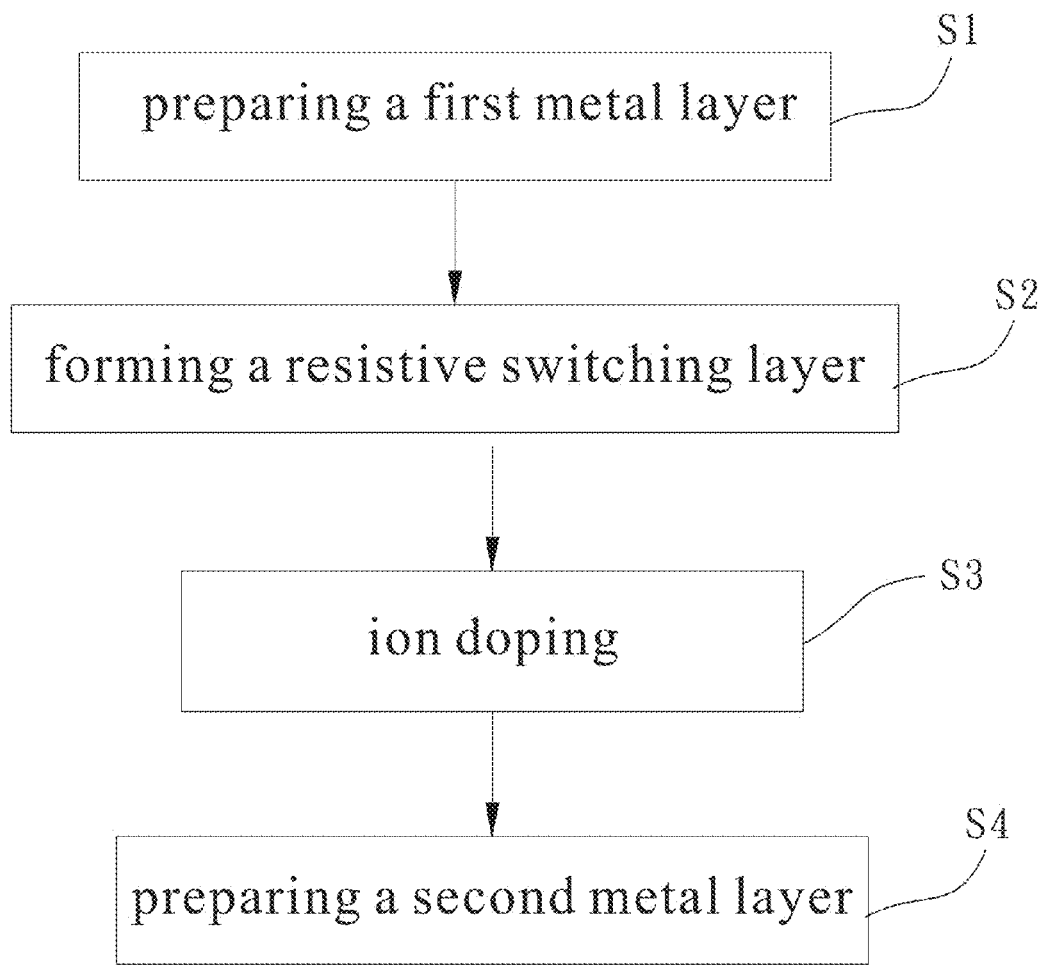
FIG. 6 is a block diagram illustrating a method for producing a resistive random access memory according to the present invention.

FIG. 6 is a block diagram illustrating a method for producing a resistive random access memory according to the present invention. The method includes a step S1 of preparing a first metal layer, a step S2 of forming a resistive switching layer, an ion doping step S3, and a step S4 of forming a second metal layer.

With reference to FIG. 3, a first metal layer is prepared as an electrode layer 1 in step S1. In this embodiment, platinum or titanium nitride can be sputtered on a substrate (not shown) to form the first metal layer, such as by physical sputtering. The sputtering time can be adjusted according to the thickness of the first metal layer. The equipment and setting required for sputtering can be appreciated by one having ordinary skill in the art. Furthermore, the first metal layer can be a conductive film that has been produced, such as a film of platinum, titanium nitride, or any other conductive material. The present invention is not limited to these examples.

In step S2, a resistive switching layer is sputtered on the first metal layer. In this embodiment, insulating material with oxygen and metal material are sputtered on the first metal layer to form the resistive switching layer. The insulating material with oxygen can include silicon oxide ($S_iO_x$, wherein x=1 or 2) or hafnium oxide ($H_fO_x$, wherein x=1 or 2). The metal material can be selected from the group consisting of titanium (Ti), zirconium (Zr), hafnium (Hf), zinc (Zn), tin (Sn), nickel (Ni), aluminum (Al), gallium (Ga), indium (In), or alloys thereof. The mobile ions can include hydrogen ions ($H^+$), lithium ions ($Li^+$), sodium ions ($Na^+$), magnesium ions ($Mg^+$), potassium ions ($K^+$), or calcium ions ($Ca^{2+}$). The concentration ratio of the insulating material with oxygen to the metal material and the sputtering time can be adjusted according to actual needs.

In the ion doping step S3, surface treatment is conducted on the resistive switching layer by using a plasma containing mobile ions to dope the mobile ions into the resistive switching layer. The polarity of the mobile ions is opposite to the polarity of the oxygen ions. In this embodiment, ammonia ($NH_3$) plasma is used to conduct the surface treatment on the resistive switching layer to dope hydrogen ions into the resistive switching layer. The concentration percentage (mole percent) of the mobile ions is 0.01-10%. Similarly, plasma with cations, such as lithium ions ($Li^+$), sodium ions ($Na^+$), magnesium ions ($Mg^+$), potassium ions ($K^+$) or calcium ions ($Ca^{2+}$), can be used to proceed with the surface treatment. The present invention is not limited to this example.

In step S4, a second metal layer is sputtered on the resistive switching layer as another electrode layer 1. In this embodiment, platinum or titanium nitride can be sputtered on the resistive switching layer to form the second metal layer. The sputtering time can be adjusted according to the thickness of the first metal layer. The equipment and setting required for sputtering can be appreciated by one having ordinary skill in the art.

In view of the foregoing, the main features of the resistive random access memory and its producing method of the embodiment according to the present invention are that the resistive random access memory includes two electrode layers 1 and a resistive switching layer 2. The resistive switching layer 2 consists essentially of insulating material with oxygen, metal material, and mobile ions. The polarity of the mobile ions is opposite to the polarity of oxygen ions. By using the resistive switching layer 2 having ions of opposite polarities, cations and anions both participate in the resistance switching reaction when the resistive random access memory operates, simultaneously providing a setting effect and a resetting effect. Thus, the current-voltage curve of the resistive random access memory of the embodiment according to the present invention can be switched into a high resistance state and a low resistance state while presenting bipolar switching characteristics and including a memory identification window D to fix the sneak current in the integrated circuit of the conventional resistive random access memory.

Furthermore, the resistive random access memory and its producing method of the embodiment according to the present invention possesses the characteristics of the metal/insulator/metal/insulator/metal (five-layer) structure of the conventional resistive random access memory but only requires the two electrode layers 1 and a metal/insulator/metal (three-layer) structure, which achieves the effect of reducing the production costs and mitigates the disadvantages of difficulties in reducing the production costs of the conventional resistive random access memory for complementary resistive switches.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A resistive random access memory comprising:
   two electrode layers; and
   a resistive switching layer mounted between the two electrode layers, with the resistive switching layer consisting essentially of insulating material with oxygen, metal material, and mobile ions, and with a polarity of the mobile ions being opposite to a polarity of oxygen ions.

2. The resistive random access memory as claimed in claim 1, wherein the mobile ions include hydrogen ions, lithium ions, sodium ions, magnesium ions, potassium ions, or calcium ions.

3. The resistive random access memory as claimed in claim 1, wherein a mole percent of the mobile ions is 0.01-10%.

4. The resistive random access memory as claimed in claim 1, wherein the insulating material with oxygen includes silicon oxide or hafnium oxide.

5. The resistive random access memory as claimed in claim 1, wherein the metal material is selected from the group consisting of titanium, zirconium, hafnium, zinc, tin, nickel, aluminum, gallium, indium, or alloys thereof.

6. The resistive random access memory as claimed in claim 1, wherein the two electrode layers are made of platinum or titanium nitride.

7. The resistive random access memory as claimed in claim 1, wherein the resistive switching layer has a thickness of 2-20 nm.

* * * * *